US012010801B2

(12) United States Patent
Torii et al.

(10) Patent No.: US 12,010,801 B2
(45) Date of Patent: Jun. 11, 2024

(54) SUBSTRATE WORK MACHINE

(71) Applicant: FUJI CORPORATION, Chiryu (JP)

(72) Inventors: Hisahiro Torii, Chiryu (JP); Takuya Nagaishi, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 52 days.

(21) Appl. No.: 17/629,703

(22) PCT Filed: Jul. 25, 2019

(86) PCT No.: PCT/JP2019/029178
§ 371 (c)(1),
(2) Date: Jan. 24, 2022

(87) PCT Pub. No.: WO2021/014635
PCT Pub. Date: Jan. 28, 2021

(65) Prior Publication Data
US 2022/0272883 A1    Aug. 25, 2022

(51) Int. Cl.
*H05K 13/08* (2006.01)
*H05K 13/04* (2006.01)

(52) U.S. Cl.
CPC ..... *H05K 13/0473* (2013.01); *H05K 13/0882* (2018.08); *H05K 13/0812* (2018.08); *H05K 13/082* (2018.08); *Y10T 29/53174* (2015.01)

(58) Field of Classification Search
CPC .......... H05K 13/0473; H05K 13/0812; H05K 13/082; H05K 13/0882; Y10T 29/53174
See application file for complete search history.

(56) References Cited

U.S. PATENT DOCUMENTS

| | | | | |
|---|---|---|---|---|
| 5,909,914 A | * | 6/1999 | Imai | H05K 13/0408 |
| | | | | 29/564.1 |
| 6,609,295 B1 | | 8/2003 | Koyama et al. | |

FOREIGN PATENT DOCUMENTS

| | | |
|---|---|---|
| JP | 5-90788 A | 4/1993 |
| JP | 2001-15999 A | 1/2001 |
| JP | 2020065039 A * | 4/2020 |

OTHER PUBLICATIONS

I. Zainuddin, "An Introduction of Strip Chopping Cut Method to Establish a Robust Strip Based Dicing Process on Tape Dicing Concept," 2018 IEEE 38th International Electronics Manufacturing Technology Conference (IEMT), Melaka, Malaysia, 2018, pp. 1-7. (Year: 2018).*
International Search Report dated Sep. 24, 2019 in PCT/JP2019/029178 filed on Jul. 25, 2019, 2 pages.

* cited by examiner

*Primary Examiner* — A. Dexter Tugbang
(74) *Attorney, Agent, or Firm* — Oblon, McClelland, Maier & Neustadt, L.L.P.

(57) ABSTRACT

A board work machine includes a board holding portion configured to hold a board, a work head configured to hold a lead component having a lead wire and insert the lead wire into a through-hole formed in the board, a lead wire cutting device configured to cut the lead wire inserted into the board by relatively reciprocally moving a first blade portion and a second blade portion, a distortion sensor configured to detect distortion of at least one of the first blade portion or the second blade portion, and a control device configured to drive the lead wire cutting device to acquire a value from the distortion sensor when the lead wire is not inserted into the board.

9 Claims, 10 Drawing Sheets

SUBSTRATE WORK MACHINE

TECHNICAL FIELD

The present disclosure relates to a lead wire cutting device that cuts a lead wire inserted into a board.

BACKGROUND ART

In the conventional art, various techniques have been proposed for the lead wire cutting device.

For example, a technique disclosed in Patent Literature 1 relates to a component fixing method in an electronic component inserter that clinches a lead of an electronic component with a lead inserted in a lead hole formed in a circuit board with clinch means to fix the electronic component with a lead to the circuit board, in which a comparison reference value corresponding to an inherent value such as a wire diameter, a material, and a shear stress of the lead is selected for each type of electronic component with a lead to be inserted, the stress distortion generated in the clinch means is detected, and the good or bad quality of the insertion and fixation of the electronic component with a lead is determined by comparing the selected comparison reference value with a value of the detected stress distortion.

PATENT LITERATURE

Patent Literature 1: JP-A-2001-15999

BRIEF SUMMARY

Technical Problem

However, in a case where the lead of the electronic component with a lead is also cut when the lead is clinched, and a tip portion of the lead is separated from the electronic component with a lead due to the cut, if the cut end portion of the separated lead is caught in a gap of a movable blade or stacked in the clinch means, the stress distortion is generated in the clinch means due to the resistance caused by the cut end portion of the stacked lead.

In such a case, for example, even in a state in which the lead of the electronic component with a lead is not inserted into the lead hole of the circuit board, since the stress distortion is generated in the clinch means when the clinch means operates, it is difficult to determine the good or bad quality of insertion and fixation of the electronic component with a lead.

The present disclosure has been made in view of the circumstances, and an object of the present disclosure is to determine an operation failure of a lead wire cutting device provided in a board work machine based on a value from a distortion sensor.

Solution to Problem

According to the present specification, there is provided a board work machine including a board holding portion configured to hold a board; a work head configured to hold a lead component having a lead wire and insert the lead wire into a through-hole formed in the board; a lead wire cutting device configured to cut the lead wire inserted into the board by relatively reciprocally moving a first blade portion and a second blade portion; a distortion sensor configured to detect distortion of at least one of the first blade portion or the second blade portion; and a control device configured to drive the lead wire cutting device to acquire a value from the distortion sensor when the lead wire is not inserted into the board.

Advantageous Effects

According to the present disclosure, it is possible to determine an operation failure of the lead wire cutting device provided in the board work machine based on a value from the distortion sensor.

DESCRIPTION OF EMBODIMENTS

Hereinafter, preferred embodiments of the present disclosure will be described in detail with reference to the drawings.

Figure 1:
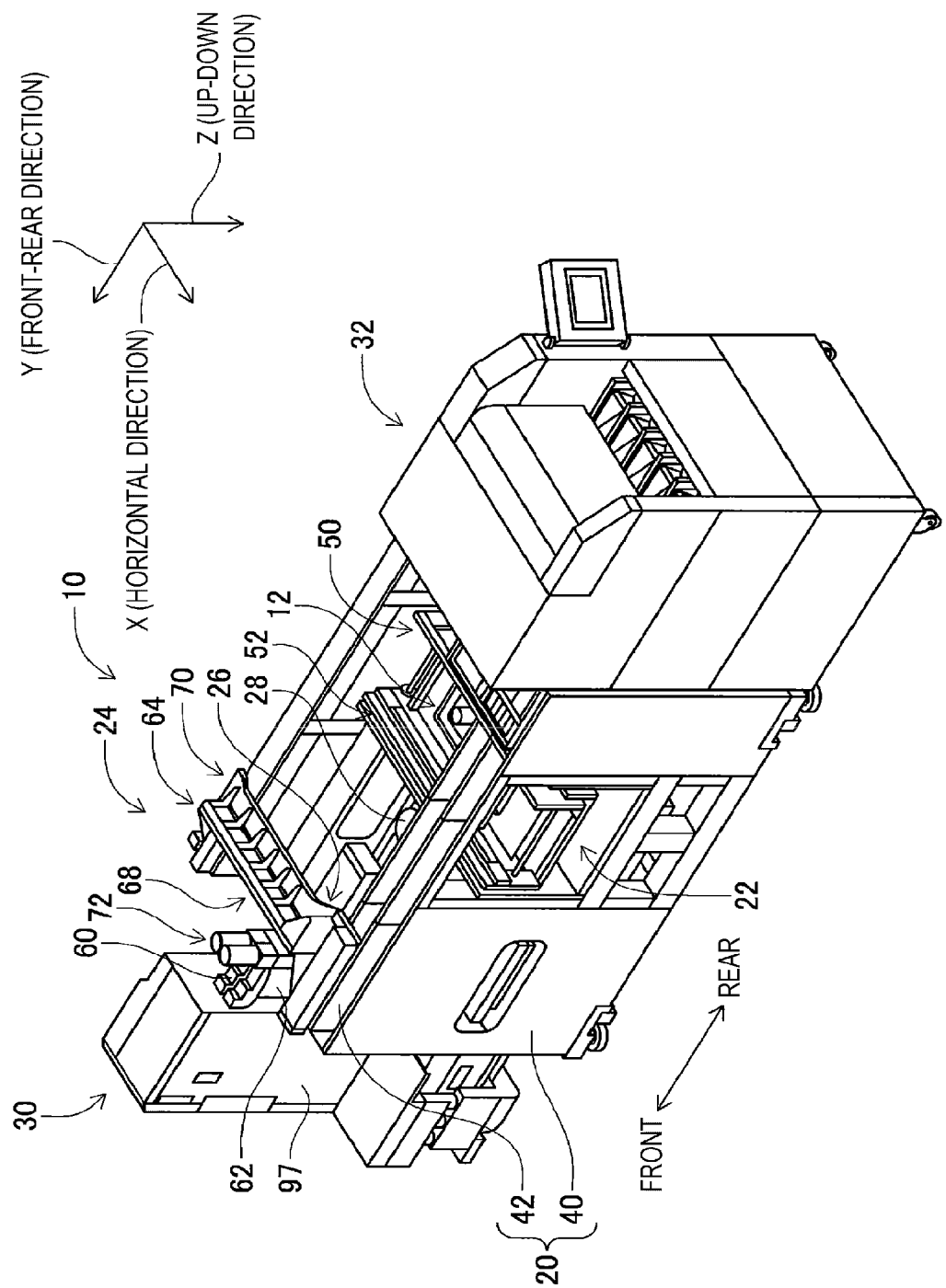
FIG. 1 is a perspective view illustrating a component mounter.

FIG. 1 illustrates component mounter 10. Component mounter 10 is a device that executes component mounting work on circuit base material 12. Component mounter 10 includes device main body 20, base material conveyance/holding device 22, component attachment device 24, mark camera 26, part camera 28, component supply device 30, bulk component supply device 32, cut-and-clinch device (refer to FIG. 7) 34, and control device (refer to FIG. 7) 36. Examples of circuit base material 12 include a circuit board and a base material having a three-dimensional structure, and examples of the circuit board include a printed wiring board and a printed circuit board.

Device main body 20 includes frame portion 40 and beam portion 42 that is suspended on frame portion 40. Base material conveyance/holding device 22 is disposed at the center of frame portion 40 in the front-rear direction, and has conveyance device 50 and clamp device 52. Conveyance device 50 is a device that conveys circuit base material 12, and clamp device 52 is a device that holds circuit base material 12. Consequently, base material conveyance/holding device 22 conveys circuit base material 12 and holds circuit base material 12 fixedly at a predetermined position. In the description below, a conveyance direction of circuit base material 12 will be referred to as an X direction, a horizontal direction perpendicular to that direction will be referred to as a Y direction, and a vertical direction will be referred to as a Z direction. That is, a width direction of component mounter 10 is the X direction, and a front-rear direction is the Y direction.

Figure 2:
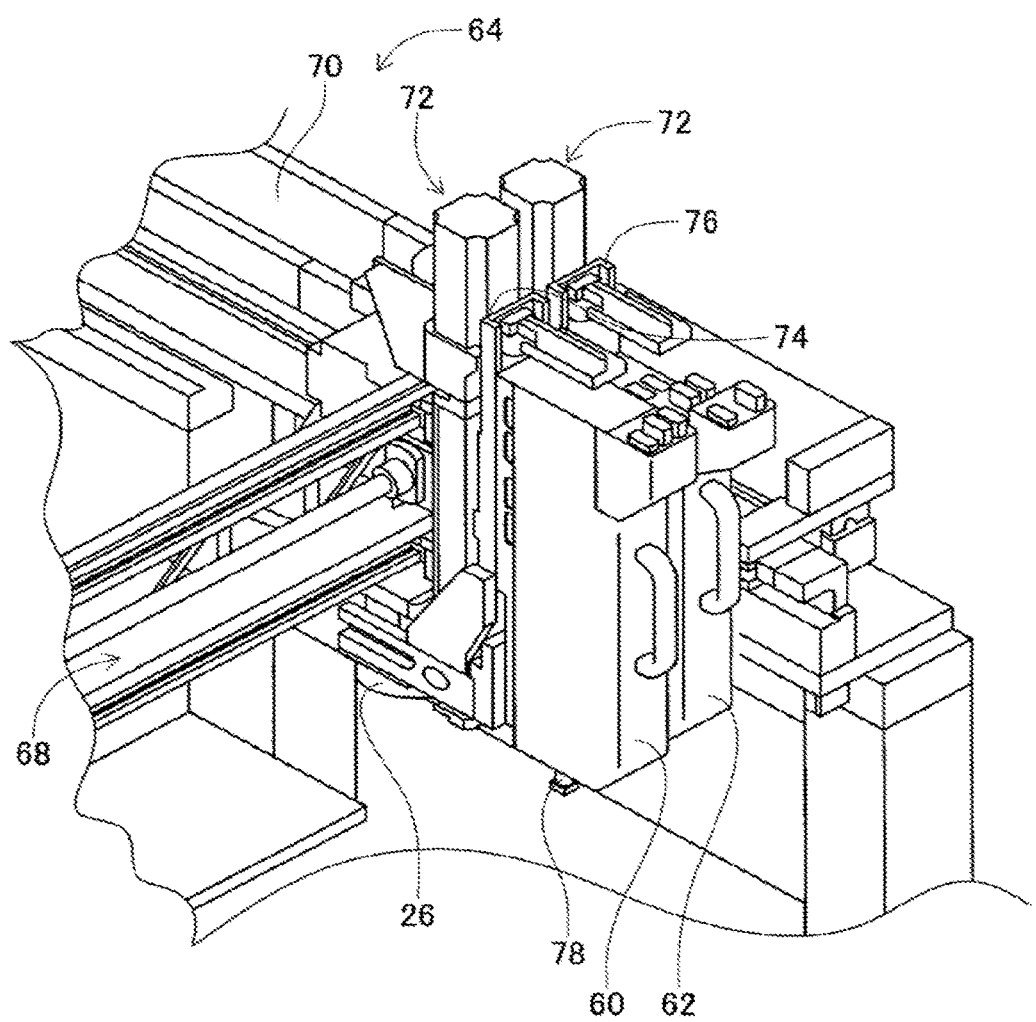
FIG. 2 is a perspective view illustrating a component attachment device.

Component attachment device 24 is disposed in beam portion 42 and includes two work heads 60 and 62 and work head moving device 64, as also illustrated in FIG. 2. Work head moving device 64 includes X-direction moving device 68, Y-direction moving device 70, and Z-direction moving device 72. Two work heads 60 and 62 are integrally moved to any position above frame portion 40 by X-direction moving device 68 and Y-direction moving device 70. Work heads 60 and 62 are detachably attached to sliders 74 and 76, and Z-direction moving device 72 moves sliders 74 and 76 individually in the up-down direction. That is, work heads 60 and 62 are individually moved in the up-down direction by Z-direction moving device 72.

Component holding tool 78 is attached to a lower end face of each of work heads 60 and 62. Component holding tool 78 holds a lead wire of a lead component, and includes opening/closing device (refer to FIG. 7) 86 and air cylinder (refer to FIG. 7) 90. Since component holding tool 78 is a well-known technique, detailed descriptions thereof will be omitted.

As illustrated in FIG. 2, mark camera 26 is attached to slider 74 in a state of facing downward, and is moved in the X direction, the Y direction, and the Z direction together with work head 60. Consequently, mark camera 26 images any position on frame portion 40. As illustrated in FIG. 1, part camera 28 is disposed in a state of facing upward between base material conveyance/holding device 22 and component supply device 30 on frame portion 40. Consequently, part camera 28 images a component held by component holding tool 78 of work heads 60 and 62.

Component supply device 30 is disposed on at an end part on a first side of frame portion 40 in the front-rear direction. Component supply device 30 includes tray-type component supply device 97 and feeder-type component supply device 98 (refer to FIG. 7). Tray-type component supply device 97 is a device that supplies a component placed on a tray. Feeder-type component supply device 98 is a device that supplies a component with a tape feeder or a stick feeder (not illustrated).

Bulk component supply device 32 is disposed at an end part on a second side of frame portion 40 in the front-rear direction. Bulk component supply device 32 is a device that aligns multiple scattered components and supplies the components in an aligned state. That is, the bulk component supply device is a device that aligns multiple components in any posture to a predetermined posture, and supplies the components in the predetermined posture.

Examples of components supplied by component supply device 30 and bulk component supply device 32 include electronic circuit components, solar cell components, and power module components. Such electronic circuit components include components with or without leads, and the like.

Figure 3:
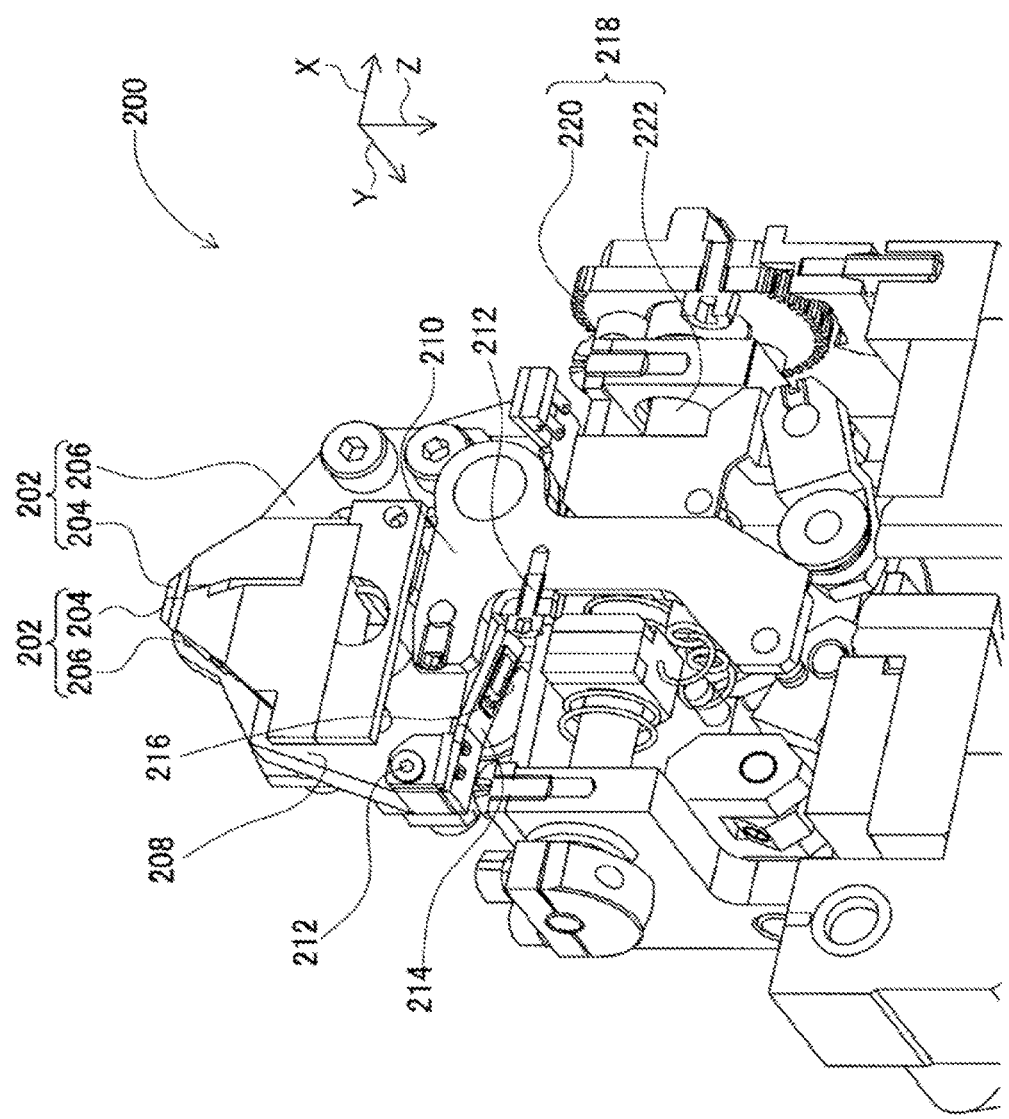
FIG. 3 is a perspective view illustrating a clinch head.
Figure 4:
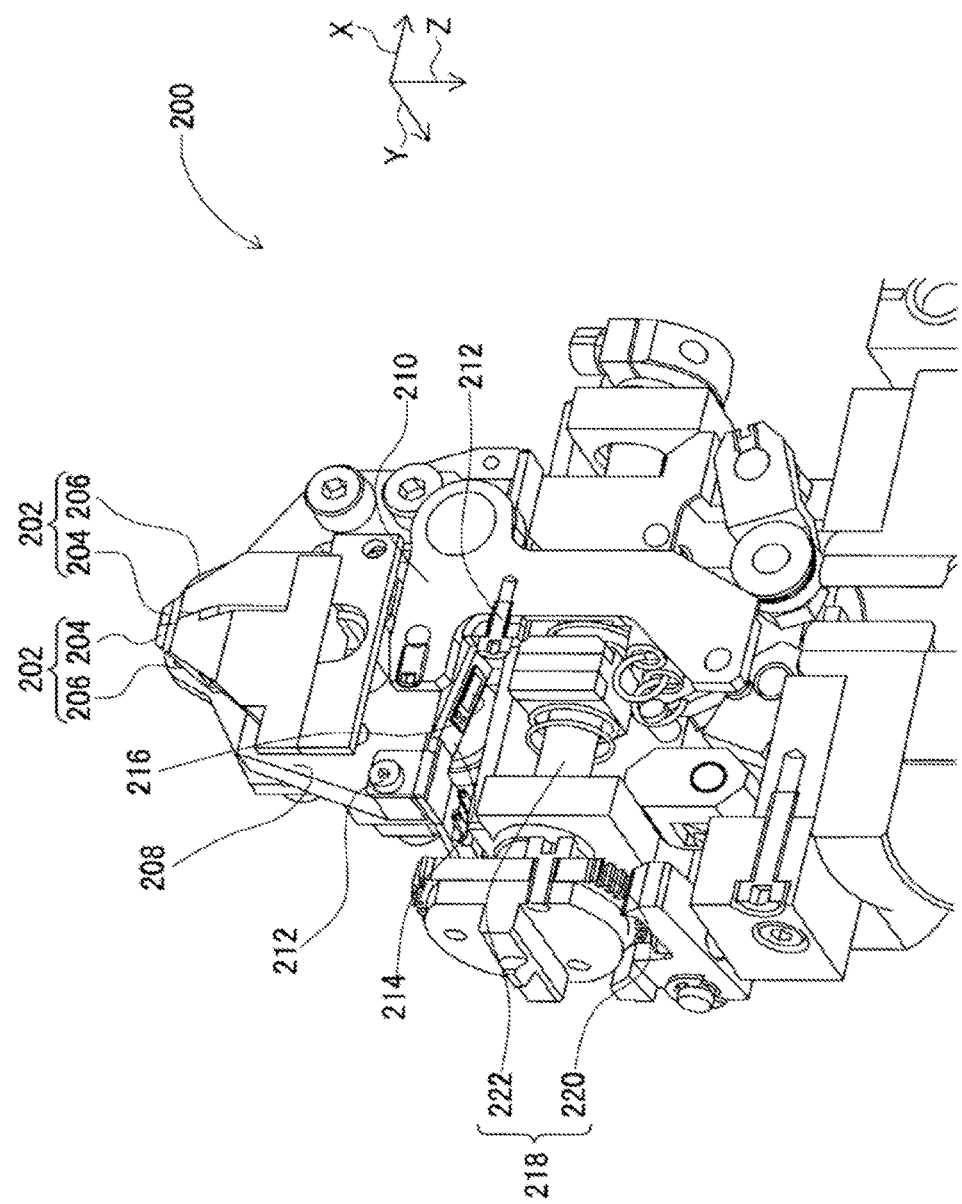
FIG. 4 is a perspective view illustrating the clinch head.

Cut-and-clinch device 34 is disposed below conveyance device 50 and has clinch head 200 as illustrated in FIGS. 3 and 4.

Clinch head 200 has a pair of slide bodies 202. Each of the pair of slide bodies 202 is configured to be slidable and has a stationary blade portion 204 and movable blade portion 206. Stationary blade portion 204 is fixed to slide body 202. On the other hand, movable blade portion 206 is configured to be relatively reciprocally movable by a cylinder (not illustrated) with respect to stationary blade portion 204 in slide body 202. A pitch of the pair of slide bodies 202 is changed by pitch changing mechanism 218. Pitch changing mechanism 218 is a mechanism including gear 220, shaft 222, and the like.

Each of the pair of slide bodies 202 further includes first member 208, second member 210, a pair of bolts 212, plate member 214, and distortion sensor 216. Plate member 214 has both ends fixed by the pair of bolts 212 and is provided to extend between first member 208 fixed to movable blade portion 206 and second member 210. Distortion sensor 216 is adhered to a lower surface of plate member 214. Thus, when movable blade portion 206 is operated, plate member 214 is curved, and thus a value from distortion sensor 216 is changed. Consequently, it is possible to indirectly measure the distortion of movable blade portion 206 by using a value from distortion sensor 216. That is, in the present embodiment, measurement of the distortion of movable blade portion 206 is performed by distortion sensor 216 measuring the distortion of plate member 214.

Figure 5:
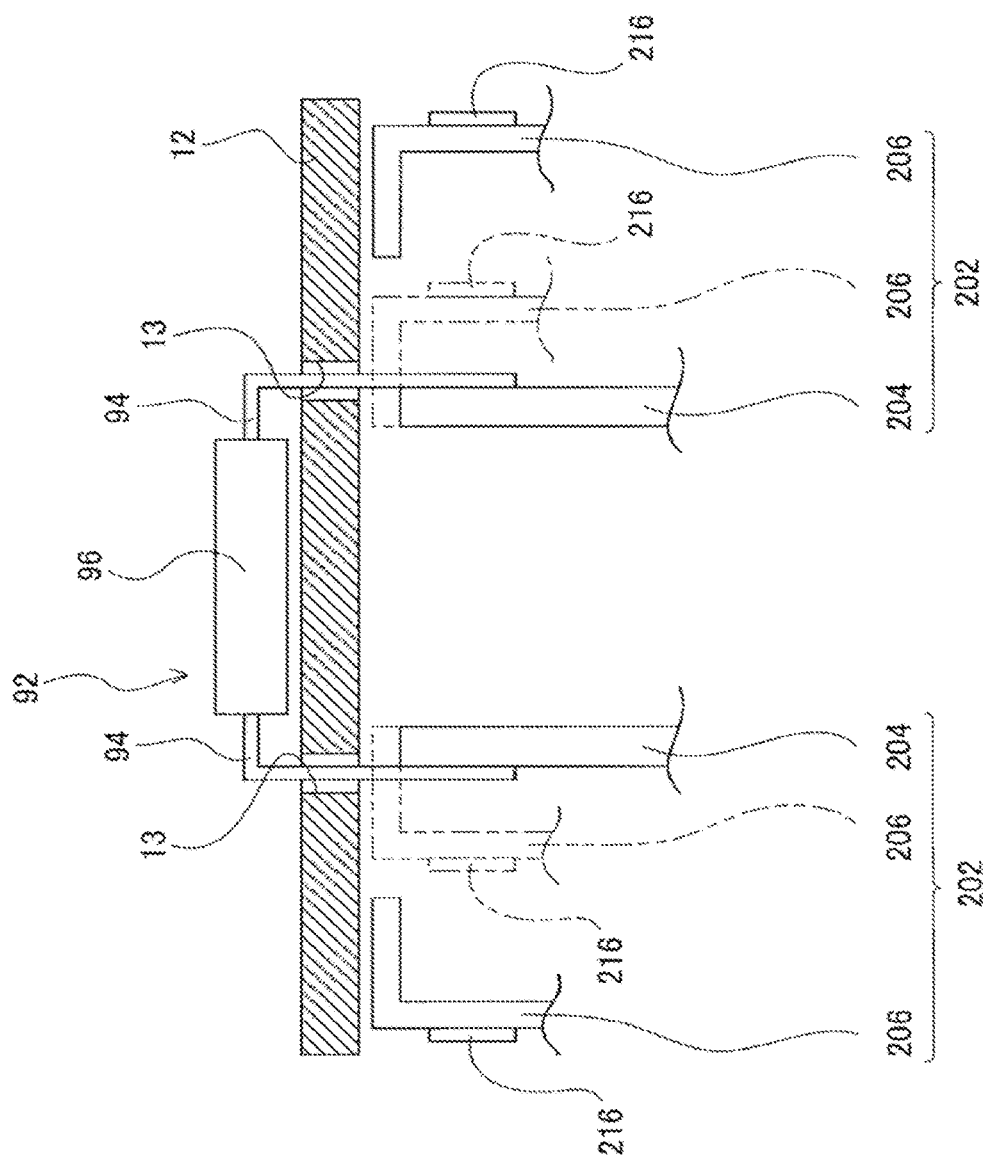
FIG. 5 is an explanatory view illustrating a slide body immediately before a lead wire of a lead component is cut.

When mounting work for a component on circuit base material 12 is executed in component mounter 10, as illustrated in FIG. 5, a pair of lead wires 94 of lead component 92 are inserted into a pair of through-holes 13 of circuit base material 12 (hereinafter, referred to as lead inserting work). Lead component 92 is of an axial type in which the pair of lead wires 94 protrude from both end faces of component main body 96. Lead component 92 is held by component holding tool 78 in a state in which the pair of lead wires 94 are bent in the same down direction, so that the lead inserting work is performed by causing component holding tool 78 to approach and separate circuit base material 12 from the upper side. Consequently, the pair of lead wires 94 of lead component 92 is in a state of protruding downward from the pair of through-holes 13 of circuit base material 12.

The pair of lead wires 94 of lead component 92 are bent in the same direction when lead component 92 is supplied by component supply device 30 or bulk component supply device 32, but may be bent in the same direction by component holding tool 78 holding lead component 92. Since such bending is performed according to a well-known technique, a detailed description thereof will be omitted.

Figure 6:
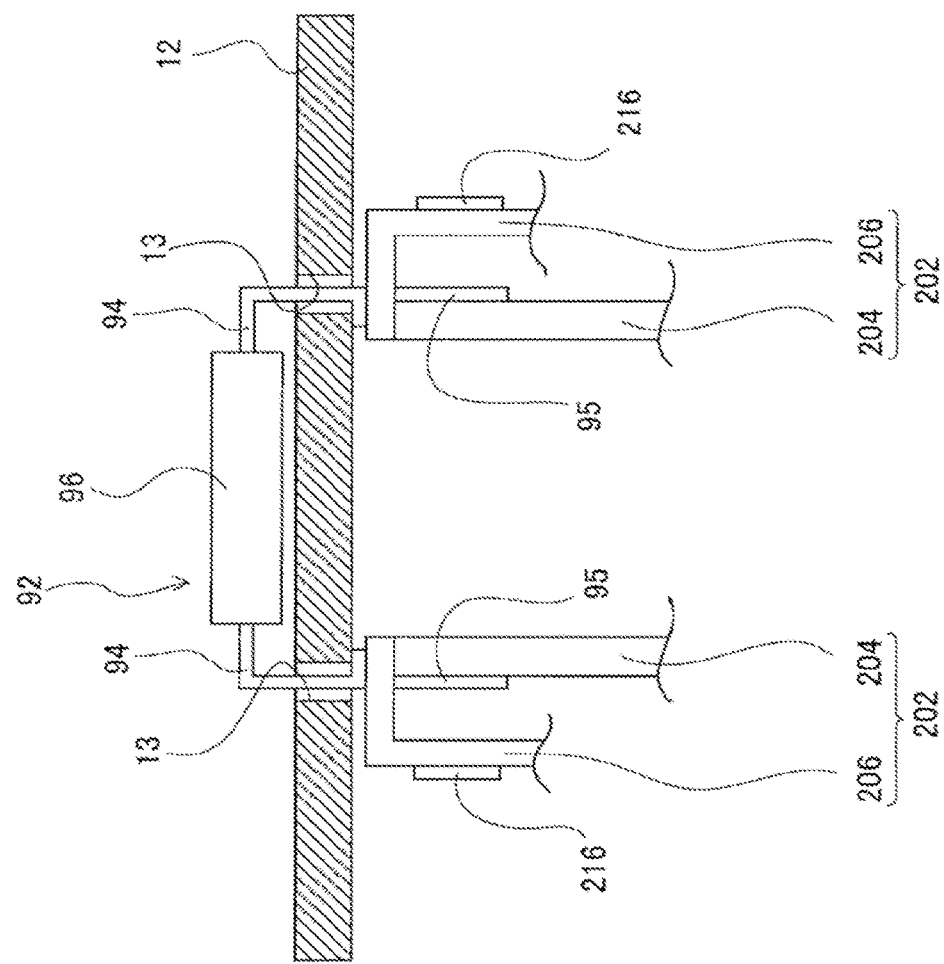
FIG. 6 is an explanatory view illustrating slide body immediately after the lead wire of the lead component is cut.

When the lead inserting work is performed, clinch head 200 of cut-and-clinch device 34 approaches circuit base material 12 from below. Consequently, in clinch head 200, the pair of lead wires 94 of lead component 92 are in a state of being inserted between stationary blade portion 204 and movable blade portion 206 in each of the pair of slide bodies 202. In such a state, when movable blade portion 206 is moved toward stationary blade portion 204 as indicated by two-dot chain lines in FIG. 5, the pair of lead wires 94 of lead component 92 are cut and bent as illustrated in FIG. 6. Consequently, lead component 92 is mounted on circuit base material 12. Thereafter, clinch head 200 is moved downward and is separated from circuit base material 12.

When tip portions of the pair of lead wires 94 are separated from lead component 92 due to the cut, separated cut end portions 95 fall between stationary blade portion 204 and movable blade portion 206 and are accommodated in a discard box (not illustrated).

In the above-described way, the movement of movable blade portion 206 toward stationary blade portion 204 when the pair of lead wires 94 of lead component 92 are inserted into the pair of through-holes 13 of circuit base material 12 will be referred to as actual striking in the present specification. At the time of actual striking, the distortion of movable blade portion 206 is measured by distortion sensor 216 as described above.

Figure 7:
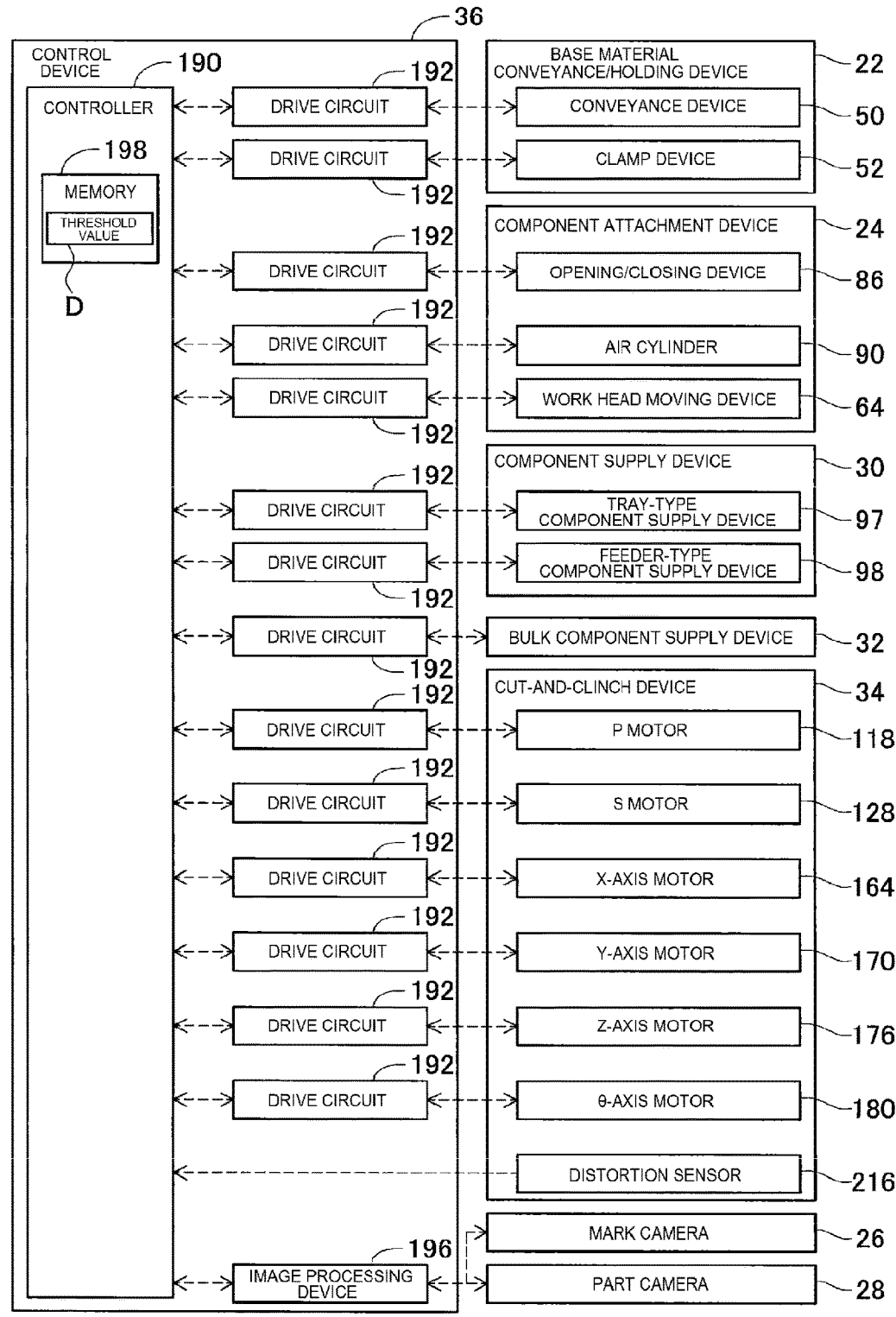
FIG. 7 is a block diagram illustrating a control device.

As illustrated in FIG. 7, control device 36 includes controller 190, multiple drive circuits 192, and image processing device 196. Multiple drive circuits 192 are connected to motors 118, 128, 164, 170, 176, and 180 in addition to conveyance device 50, clamp device 52, work head moving device 64, opening/closing device 86, air cylinder 90, tray-type component supply device 97, feeder-type component supply device 98, and bulk component supply device 32. Controller 190 includes CPU, ROM, RAM, and the like, and is mainly a computer, and is connected to multiple drive circuits 192 and distortion sensor 216. Consequently, operations of base material conveyance/holding device 22, component attachment device 24, component supply device 30, bulk component supply device 32, and cut-and-clinch device 34 are controlled by controller 190. Controller 190 is also connected to image processing device 196. Image processing device 196 is a device that processes image data obtained by mark camera 26 and part camera 28, and controller 190 acquires various pieces of information from the image data. Controller 190 includes memory 198. The various pieces of information (for example, threshold value D) required to execute the mounting work are stored in memory 198, and controller 190 acquires the information required during the mounting work from memory 198.

Each of motors 118, 128, 164, 170, 176, and 180 is an electromagnetic motor and is provided in cut-and-clinch device 34. P motor 118 is operated to controllably change a distance between the pair of slide bodies 202. Consequently, in a case where a size of a lead component that is a mounting target is changed, it is possible to change a distance between the pair of slide bodies 202 in accordance with a distance between the pair of lead wires bent in the same down direction. S motor 128 is operated to controllably move movable blade portion 206. X-axis motor 164 is operated to controllably move clinch head 200 in the X direction. Y-axis motor 170 is operated to controllably move clinch head 200 in the Y direction. Z-axis motor 176 is operated to controllably move clinch head 200 in the Z direction. θ-axis motor 180 is operated to controllably rotate clinch head 200 with the Z direction as a rotation axis.

Figure 8:
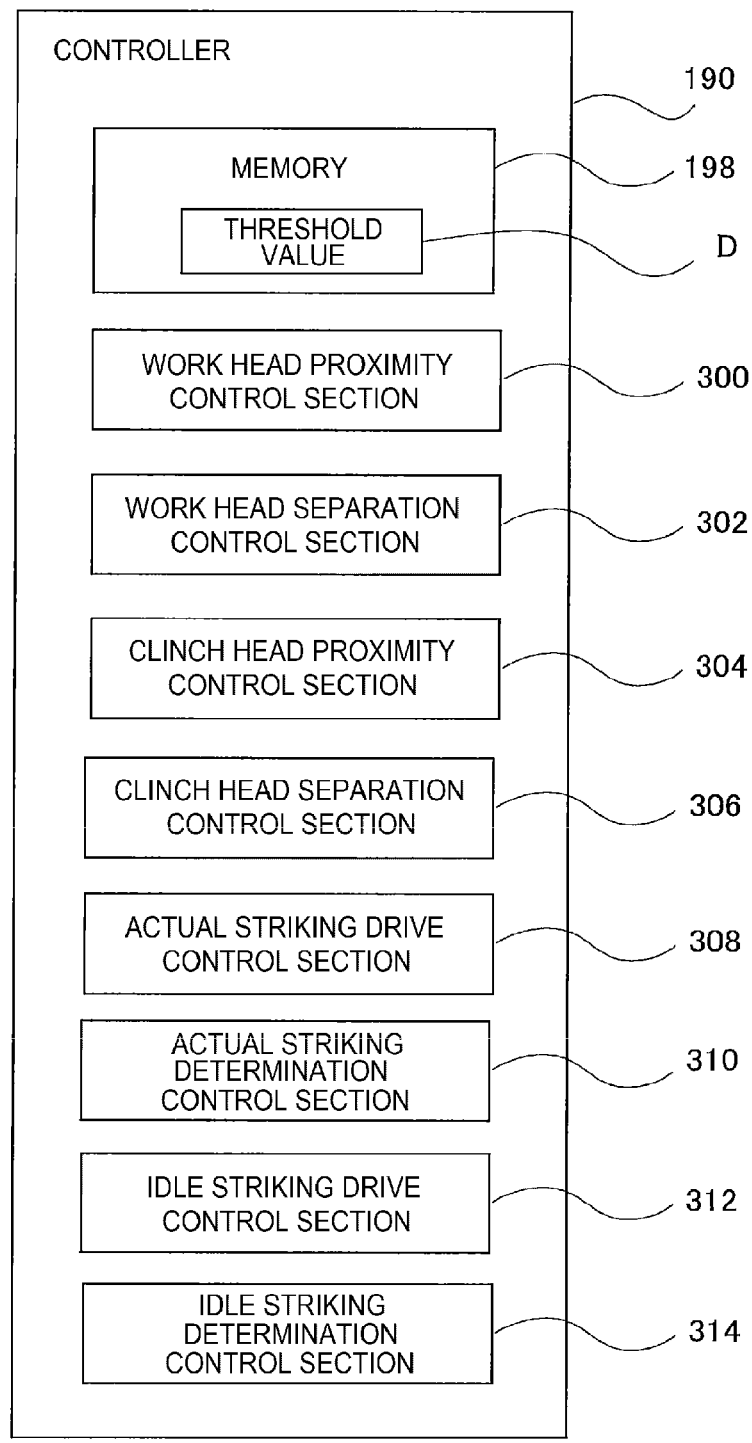
FIG. 8 is a block diagram illustrating a controller.

As illustrated in FIG. 8, controller 190 includes work head proximity control section 300, work head separation control section 302, clinch head proximity control section 304, clinch head separation control section 306, actual striking drive control section 308, actual striking determination control section 310, idle striking drive control section 312, and idle striking determination control section 314 in addition to above memory 198.

Work head proximity control section 300 is a functional section that inserts the pair of lead wires 94 of lead component 92 into the pair of through-holes 13 of circuit base material 12 by causing work heads 60 and 62 to come close to circuit base material 12 from above with work head moving device 64. Work head separation control section 302 is a functional section that separates work heads 60 and 62 upward from circuit base material 12 with work head moving device 64.

Clinch head proximity control section 304 is a functional section that causes clinch head 200 to come close to circuit base material 12 from below with motors 164, 170, 176, and the like. The clinch head separation control section 306 is a functional section that separates clinch head 200 downward from circuit base material 12 with motors 164, 170, and 176, and the like.

Actual striking drive control section 308 is a functional section that reciprocally moves movable blade portion 206 relative to stationary blade portion 204 by driving cut-and-clinch device 34 with S motor 128 or the like when the pair of lead wires 94 of lead component 92 are inserted into the pair of through-holes 13 of circuit base material 12. Actual striking determination control section 310 is a functional section that determines whether an operation of cut-and-clinch device 34 while actual striking drive control section 308 is functioning is normal by comparing a value from distortion sensor 216 acquired while actual striking drive control section 308 is functioning with threshold value D in memory 198.

Figure 9:
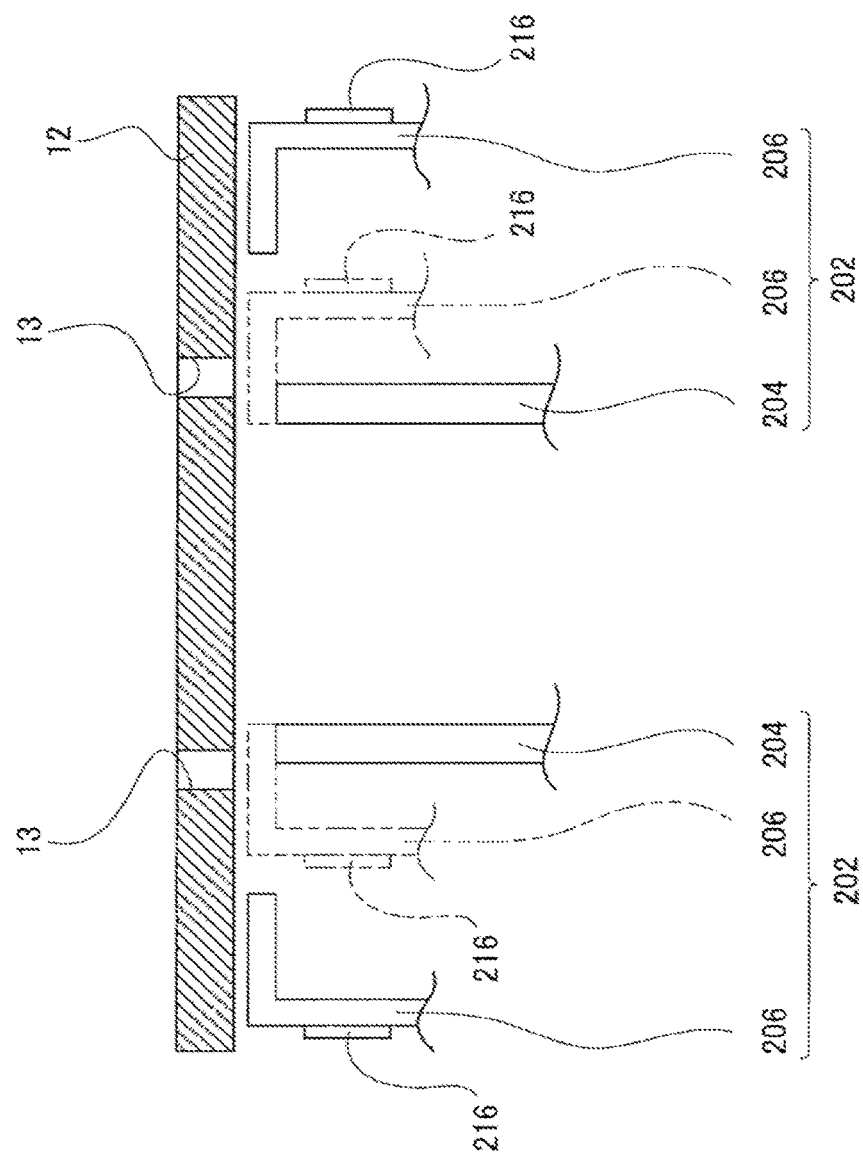
FIG. 9 is an explanatory view illustrating slide body at the time of idle striking.

Idle striking drive control section 312 is a functional section that reciprocally moves movable blade portion 206 relative to stationary blade portion 204 by driving cut-and-clinch device 34 with S motor 128 or the like when the pair of lead wires 94 of lead component 92 are not inserted between stationary blade portion 204 and movable blade portion 206. For example, as illustrated in FIG. 9, idle striking drive control section 312 functions when the pair of lead wires 94 of lead component 92 are not inserted into the pair of through-holes 13 of circuit base material 12. However, even if the pair of lead wires 94 of lead component 92 is inserted into the pair of through-holes 13 of circuit base material 12, after lead component 92 is mounted on circuit base material 12 by cutting and bending the pair of lead wires 94, the pair of lead wires 94 of lead component 92 is placed in a state of not being inserted between stationary blade portion 204 and movable blade portion 206, so that idle striking drive control section 312 can function.

In the above-described way, when the pair of lead wires 94 of lead component 92 are not inserted into the pair of through-holes 13 of circuit base material 12, or when the pair of lead wires 94 of lead component 92 are not inserted between stationary blade portion 204 and movable blade portion 206, movement of movable blade portion 206 toward stationary blade portion 204 will be referred to as idle striking in the present specification. At the time of idle striking, the distortion of movable blade portion 206 is measured by distortion sensor 216 as described above.

Idle striking determination control section 314 is a functional section that determines whether an operation of cut-and-clinch device 34 while idle striking drive control section 312 is functioning is normal by comparing a value from distortion sensor 216 acquired while idle striking drive control section 312 is functioning with threshold value D in memory 198.

Figure 10:
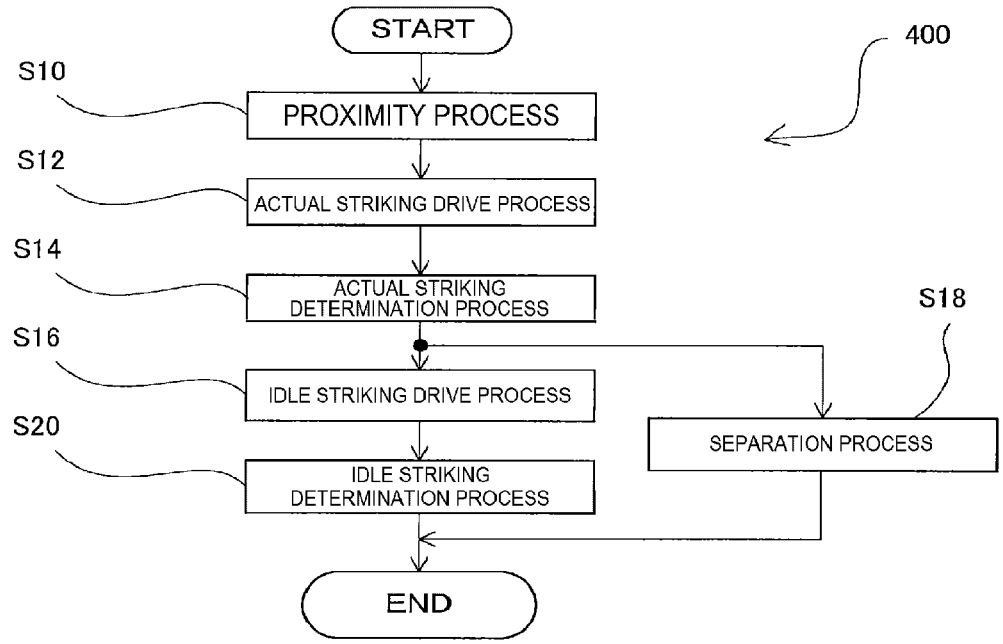
FIG. 10 is a flowchart illustrating a flow of mounting work.

Next, the mounting work performed by component mounter 10 will be described with reference to a flowchart of FIG. 10. Control method 400 for component mounter 10 illustrated in the flowchart of FIG. 10 includes processes in S10 to S20, stored in the ROM of controller 190, and executed by the CPU of controller 190 when the mounting work is performed. Various data used in the flowchart of FIG. 10 are stored in the ROM, the RAM, or the like of controller 190 except for threshold value D stored in memory 198.

In proximity process S10, after lead component 92 is held by component holding tool 78, work head proximity control section 300 and clinch head proximity control section 304 function. Consequently, work heads 60 and 62 come close to circuit base material 12 from above, and thus the pair of lead wires 94 of lead component 92 are inserted into the pair of through-holes 13 of circuit base material 12. Clinch head 200 comes close to circuit base material 12 from below, and thus as illustrated in FIG. 5, the pair of lead wires 94 of lead component 92 are brought into a state of being inserted between stationary blade portion 204 and movable blade portion 206. One of work head proximity control section 300 and clinch head proximity control section 304 may function in advance, or both may function simultaneously.

In actual striking drive process S12, actual striking drive control section 308 functions. Consequently, when the pair of lead wires 94 of lead component 92 are inserted into the pair of through-holes 13 of circuit base material 12, movable blade portion 206 is reciprocally moved relative to stationary blade portion 204. Thus, as illustrated in FIG. 6, the pair of lead wires 94 of lead component 92 are cut and bent, and thus lead component 92 is mounted on circuit base material 12.

In actual striking determination process S14, actual striking determination control section 310 functions, and thus it is determined whether an operation of cut-and-clinch device 34 is normal while actual striking drive control section 308 is functioning (during the execution of actual striking drive process S12). In the determination, as indicated by two-dot chain lines in FIG. 5, a value from distortion sensor 216 when movable blade portion 206 reaches stationary blade portion 204 (that is, when the pair of lead wires 94 of lead component 92 are cut and bent) is acquired, and when the acquired value from distortion sensor 216 is greater than threshold value D in memory 198, it is determined that cut-and-clinch device 34 is normal. In contrast, when the acquired value from distortion sensor 216 is equal to or smaller than threshold value D in memory 198, it is determined that cut-and-clinch device 34 is abnormal, and thus error stoppage is performed (not illustrated).

The value from distortion sensor 216 may be acquired before movable blade portion 206 reaches stationary blade portion 204 (that is, before the pair of lead wires 94 of lead component 92 are cut and bent), or may be acquired when movable blade portion 206 becomes distant from stationary blade portion 204 (that is, after the pair of lead wires 94 of lead component 92 are cut and bent).

After it is determined that cut-and-clinch device 34 is normal, idle striking drive process S16 and separation process S18 are performed.

In idle striking drive process S16, idle striking drive control section 312 functions. Consequently, movable blade portion 206 is reciprocally moved relative to stationary blade portion 204 when the pair of lead wires 94 of lead component 92 are not inserted between stationary blade portion 204 and movable blade portion 206. In separation process S18, work head separation control section 302 and clinch head separation control section 306 function. Consequently, work heads 60 and 62 are separated upward from circuit base material 12, and clinch head 200 is separated downward from circuit base material 12.

One of idle striking drive process S16 and separation process S18 may function in advance, or both may function simultaneously. In a case where separation process S18 is performed prior to idle striking drive process S16, separation process S18 may be performed when movable blade portion 206 becomes distant from stationary blade portion 204 (that is, after the pair of lead wires 94 of lead component 92 are cut and bent) while actual striking drive control section 308 is functioning (during the execution of actual striking drive process S12).

After idle striking drive process S16, idle striking determination process S20 is performed. In idle striking determination process S20, idle striking determination control section 314 functions, and thus it is determined whether an operation of cut-and-clinch device 34 is normal while idle striking drive control section 312 is functioning (during the execution of idle striking drive process S16). In the determination, a value from distortion sensor 216 when movable blade portion 206 reaches stationary blade portion 204 is acquired, and when the acquired value from distortion sensor 216 is equal to or smaller than threshold value D in memory 198, it is determined that cut-and-clinch device 34 is normal, and the next sequence is executed. In contrast, when the acquired value from distortion sensor 216 is greater than threshold value D in memory 198, for example, since cut end portions 95 of the pair of lead wires 94 may be caught between stationary blade portion 204 and movable blade portion 206 or may be stacked, it is determined that cut-and-clinch device 34 is abnormal, and thus error stoppage is performed (not illustrated).

In idle striking determination process S20, in the same manner as in actual striking determination process S14, the value from distortion sensor 216 may be acquired before movable blade portion 206 reaches stationary blade portion 204 (that is, before the pair of lead wires 94 of lead component 92 are cut and bent), or may be acquired when movable blade portion 206 becomes distant from stationary blade portion 204 (that is, after the pair of lead wires 94 of lead component 92 are cut and bent). However, since the value from distortion sensor 216 is compared with threshold value D in common memory 198 in idle striking determination process S20 and actual striking determination process S14, it is desirable that timings at which the value from distortion sensor 216 is acquired are the same.

As described in detail above, in the present embodiment, it is possible to determine an operation failure of cut-and-clinch device 34 provided in component mounter 10 based on a value from distortion sensor 216.

In the present embodiment, component mounter 10 is an example of a board work machine. Circuit base material 12 is described as an example of a board. Cut-and-clinch device 34 is an example of a lead wire cutting device. Clamp device 52 is an example of a board holding portion. Work head moving device 64 is an example of a first drive section. X-axis motor 164, Y-axis motor 170, and Z-axis motor 176 are examples of a second drive section. stationary blade portion 204 is an example of a second blade portion. Movable blade portion 206 is an example of a first blade portion. Control method 400 for component mounter 10 is an example of a control method for a board work machine. Control method 402 for component mounter 10 is an example of a control method for a board work machine.

The present disclosure is not limited to the above embodiments, and various modifications may occur without departing from the scope of the concept thereof. For example, instead of control method 400 illustrated in FIG. 10, control method 402 for component mounter 10 illustrated in the flowchart of FIG. 11 may be executed. Control method 402 for component mounter 10 illustrated in the flowchart of FIG. 11 includes the respective processes in S10 to S20 in the same manner as control method 400 in FIG. 10 described above except for the determination process in S22 indicated above, but the order in which the processes in S10 to S20 are performed is different from that in control method 400 in FIG. 10 described above.

Figure 11:
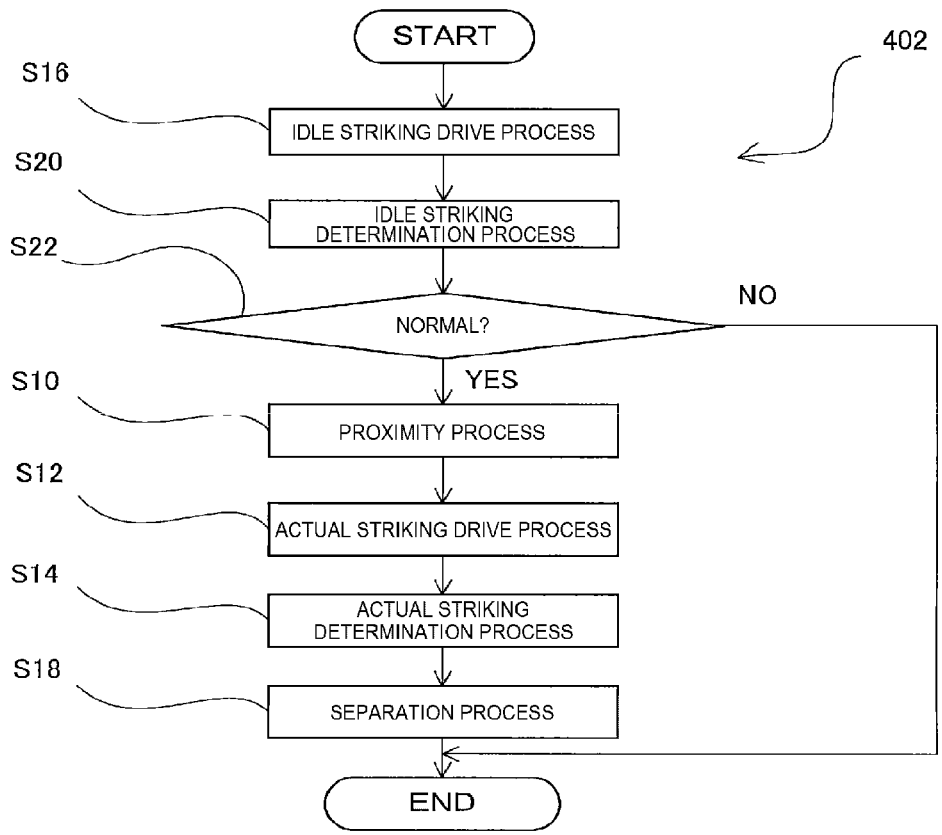
FIG. 11 is a flowchart illustrating a flow of the mounting work.

In control method 402 in FIG. 11, first, idle striking drive process S16 and idle striking determination process S20 are performed in the order in which the processes are described. When the operation of cut-and-clinch device 34 is abnormal while idle striking drive control section 312 is functioning (during the execution of idle striking drive process S16) (S22: NO), error stoppage is performed (not illustrated). On the other hand, in a case where the operation of cut-and-clinch device 34 is normal while idle striking drive control section 312 is functioning (during the execution of idle striking drive process S16) (S22: YES), proximity process S10, actual striking drive process S12, actual striking determination process S14, and separation process S18 are performed in this order. Separation process S18 may be performed while actual striking drive control section 308 is functioning (during the execution of actual striking drive process S12) when movable blade portion 206 becomes distant from stationary blade portion 204 (that is, after the pair of lead wires 94 of lead component 92 are cut and bent).

Idle striking drive process S16 and idle striking determination process S20 may be performed, for example, during maintenance of component mounter 10 regardless of control method 400 in FIG. 10 and control method 402 in FIG. 11.

Distortion sensor 216 may be attached such that a value therefrom is changed with the operation of stationary blade portion 204.

Lead component 92 may be of a radial type in which the pair of lead wires 94 protrude from the lower end face of component main body 96.

REFERENCE SIGNS LIST

10: Component mounter, 12: Circuit base material, 13: Through-hole, 34: Cut-and-clinch device, 36: Control device, 52: Clamp device, 60, 62: Work head, 64: Work head moving device, 92: Lead component, 94: Lead wire, 164: X-axis motor, 170: Y-axis motor, 176: Z-axis motor, 200: Clinch head, 204: stationary blade portion, 206: Movable blade portion, 214: Plate member, 216: Distortion sensor, 300: Work head proximity control section, 302: Work head separation control section, 304: Clinch head proximity control section, 306: Clinch head separation control section, 308: Actual striking drive control section, 310: Actual striking determination control section, 312: Idle striking drive control section, 314: Idle striking determination control section, 400: Control method for component mounter, 402: Control method for component mounter, D: Threshold value, S10: Proximity process, S12: Actual striking drive process, S14: Actual striking determination process, S16: Idle striking drive process, S18: Separation process, S20: Idle striking determination process

The invention claimed is:

1. A board work machine comprising:
a board holding portion configured to hold a board;
a work head configured to hold a lead component having a lead wire and insert the lead wire into a through-hole formed in the board;
a lead wire cutting device configured to cut the lead wire inserted into the board by relatively reciprocally moving a first blade portion and a second blade portion;
a distortion sensor configured to detect distortion of at least one of the first blade portion or the second blade portion; and
a control device configured to drive the lead wire cutting device to acquire a value from the distortion sensor when the lead wire is not inserted into the board,
wherein the control device includes
an idle striking drive control section configured to drive the lead wire cutting device when the lead wire is not inserted between the first blade portion and the second blade portion, and
an idle striking determination control section configured to deter line whether an operation of the lead wire cutting device during execution of the idle striking drive control section is normal based on a value from the distortion sensor acquired during the execution of the idle striking drive control section.

2. The board work machine according to claim 1, wherein the lead wire cutting device bends the lead wire together with cutting of the lead wire.

3. The board work machine according to claim 1, wherein the control device further includes
an actual striking drive control section configured to drive the lead wire cutting device when the lead wire is inserted into the board, and
the idle striking drive control section is executed following the actual striking drive control section.

4. The board work machine according to claim 3, further comprising:
a first drive section configured to drive the work head, wherein
the control device further includes
a work head proximity control section configured to be executed prior to the actual striking drive control section and to insert the lead wire into the board by causing the work head to come close to the board with the first drive section; and
a work head separation control section configured to separate the work head from the board with the first drive section during the execution of the idle striking drive control section.

5. The board work machine according to claim 3, further comprising:
a clinch head having the first blade portion, the second blade portion, and the distortion sensor; and
a second drive section configured to drive the clinch head, wherein
the control device further includes
a clinch head proximity control section configured to be executed prior to the actual striking drive control section and to cause the clinch head to come close to the board with the second drive section, and
a clinch head separation control section configured to separate the clinch head from the board with the second drive section during the execution of the idle striking drive control section.

6. The board work machine according to claim 3, wherein the control device further includes
an actual striking determination control section configured to determine whether an operation of the lead wire cutting device during execution of the actual striking drive control section is normal by comparing a value from the distortion sensor acquired during the execution of the actual striking drive control section with a threshold value, and
the idle striking determination control section compares the threshold value used in the actual striking determination control section with the value from the distortion sensor acquired during the execution of the idle striking drive control section to determine whether the operation of the lead wire cutting device during the execution of the idle striking drive control section is normal.

7. The board work machine according to claim 1, wherein the control device further includes
an actual striking drive control section configured to drive the lead wire cutting device when the lead wire is inserted into the board, and
the actual striking drive control section is executed following the idle striking drive control section under a condition that the idle striking determination control section determines that the operation of the lead wire cutting device during the execution of the idle striking drive control section is normal.

8. The board work machine according to claim 1, further comprising:
a plate member that is connected in a curved state to at least one of the first blade portion or the second blade portion and to which the distortion sensor is attached.

9. A method for controlling the board work machine according to claim 1, the method comprising:
driving the lead wire cutting device to acquire a value from the distortion sensor when the lead wire is not inserted into the board.

* * * * *